US006278304B1

(12) United States Patent
Livezey

(10) Patent No.: US 6,278,304 B1
(45) Date of Patent: Aug. 21, 2001

(54) LOOK-AHEAD ENABLING CHARGE PUMP IN PHASE-LOCKED LOOP CIRCUITS

(75) Inventor: Darrell Livezey, Auburn, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/535,062

(22) Filed: Mar. 23, 2000

(51) Int. Cl.[7] .................................................. H03L 7/06
(52) U.S. Cl. .......................... 327/157; 327/148; 327/162; 327/536; 331/DIG. 2; 375/374
(58) Field of Search ................................ 327/141, 142, 327/147, 148, 156, 157, 159, 150, 3, 7, 12, 390, 589, 536, 162; 331/11, 12, 17, 25, 40, DIG. 2, 1 A; 375/373–376; 365/189.07, 35; 307/110

(56) References Cited

U.S. PATENT DOCUMENTS

| 5,103,192 | 4/1992 | Sekine et al. ................. 331/1 A |
| 5,180,992 | 1/1993 | Akiyama et al. ................ 331/11 |
| 5,396,521 | 3/1995 | Minami ........................ 375/344 |
| 5,452,326 | 9/1995 | Tanaka ........................ 375/376 |
| 5,534,821 | 7/1996 | Akiyama et al. ................. 331/8 |
| 5,548,250 | 8/1996 | Fang .......................... 331/14 |
| 5,742,650 | 4/1998 | Nuckolls et al. ............... 375/376 |
| 5,764,108 | * 6/1998 | Rose et al. .................... 331/17 |
| 5,767,791 | 6/1998 | Stoop et al. ............... 340/870.11 |
| 5,939,949 | * 8/1999 | Olgaard et al. ................. 331/17 |

* cited by examiner

Primary Examiner—Timothy P. Callahan
Assistant Examiner—Minh Nguyen
(74) Attorney, Agent, or Firm—Blakely, Sokoloff, Taylor & Zafman LLP

(57) ABSTRACT

A technique controls a charge pump bias circuit in a phase-locked loop (PLL) circuit. The charge pump bias circuit biases a charge pump circuit. A digital phase detector generates direction control signals based on reference and pre-scale count signals from reference and pre-scale counting circuits, respectively. The direction control signals control direction of current pumped by the charge pump circuit. A charge pump enable generator generates an enable signal based on look-ahead reference and pre-scale count signals from the reference and pre-scale counting circuits, respectively. The look-ahead reference and pre-scale count signals are generated before the corresponding reference and pre-scale count signals by a predetermined time interval. The enable signal powers down the charge pump bias circuit after the charge pump circuit pumps the current.

24 Claims, 4 Drawing Sheets

LOOK-AHEAD ENABLING CHARGE PUMP IN PHASE-LOCKED LOOP CIRCUITS

BACKGROUND

1. Field of the Invention

This invention relates to phase-locked loops. In particular, the invention relates to the charge pump in phase-locked loop circuits.

2. Description of Related Art

A phase-locked loop (PLL) circuit generates an output signal based on a control voltage representing the phase difference between a reference phase signal and a feedback signal. A charge pump circuit pumps current to be converted into the control voltage.

The charge pump circuit is normally biased by a charge pump bias circuit. The charge pump bias circuit provides a reference signal to establish the amount of current to be pumped. In traditional PLL circuits, the charge pump circuit continuously consumes power whether or not the PLL circuit is locked. Between pulses in the output signal, the charge pump circuit is idle, but still draws current, wasting power.

Therefore there is a need in the technology to provide a simple and efficient method to control a charge pump in phase-locked loop circuits.

SUMMARY

The present invention is a method and apparatus for controlling a charge pump bias circuit in a phase-locked loop (PLL) circuit. The charge pump bias circuit biases a charge pump circuit. A digital phase detector generates direction control signals based on reference and pre-scale count signals from reference and pre-scale counting circuits, respectively. The direction control signals control the direction of current pumped by the charge pump circuit. A charge pump enable generator generates an enable signal based on look-ahead reference and pre-scale count signals from the reference and pre-scale counting circuits, respectively. The look-ahead reference and pre-scale count signals are generated before the corresponding reference and pre-scale count signals by a predetermined time interval. The enable signal turns on the bias circuit just before the charge pump circuit pumps current and powers down the charge pump bias circuit just after the charge pump circuit pumps the current.

In one embodiment, the digital phase detector comprises first and second synchronizers and a reset generator; and the charge pump enable generator comprises a look-ahead circuit and an enable gating circuit. The first synchronizer generates the up direction signal based on a reference count signal from the reference counting circuit. A second synchronizer generates the down direction signal based on a pre-scale count signal from the pre-scale counting circuit. A reset generator generates a reset signal, the reset signal resetting the first and second synchronizers. The look-ahead circuit generates a look-ahead signal at a time interval before the direction control signals are generated. The enable gating circuit gates the look-ahead signal with a lock detection signal, the gated look-ahead signal corresponding to the enable signal.

BRIEF DESCRIPTION OF THE DRAWINGS

The features and advantages of the present invention will become apparent from the following detailed description of the present invention in which.

DESCRIPTION

The present invention is a method and apparatus for controlling a charge pump bias circuit in a phase-locked loop (PLL) circuit. The charge pump bias circuit biases a charge pump circuit. A digital phase detector generates direction control signals based on reference and pre-scale count signals from reference and pre-scale counting circuits, respectively. The direction control signals control the direction of current pumped by the charge pump circuit. A charge pump enable generator generates an enable signal based on look-ahead reference and pre-scale count signals from the reference and pre-scale counting circuits, respectively. The look-ahead reference and pre-scale count signals are generated before the corresponding reference and pre-scale count signals by a predetermined time interval. The enable signal turns on the bias just before the charge pump circuit pumps current and powers down the charge pump bias circuit just after the charge pump circuit pumps the current.

In one embodiment, the digital phase detector comprises first and second synchronizers and a reset generator; and the charge pump enable generator comprises a look-ahead circuit and an enable gating circuit. The first synchronizer generates the up direction signal based on a reference count signal from the reference counting circuit. A second synchronizer generates the down direction signal based on a pre-scale count signal from the pre-scale counting circuit. A reset generator generates a reset signal, the reset signal resetting the first and second synchronizers. The look-ahead circuit generates a look-ahead signal at a time interval before the direction control signals are generated. The enable gating circuit gates the look-ahead signal with a lock detection signal, the gated look-ahead signal corresponding to the enable signal.

Figure 1:
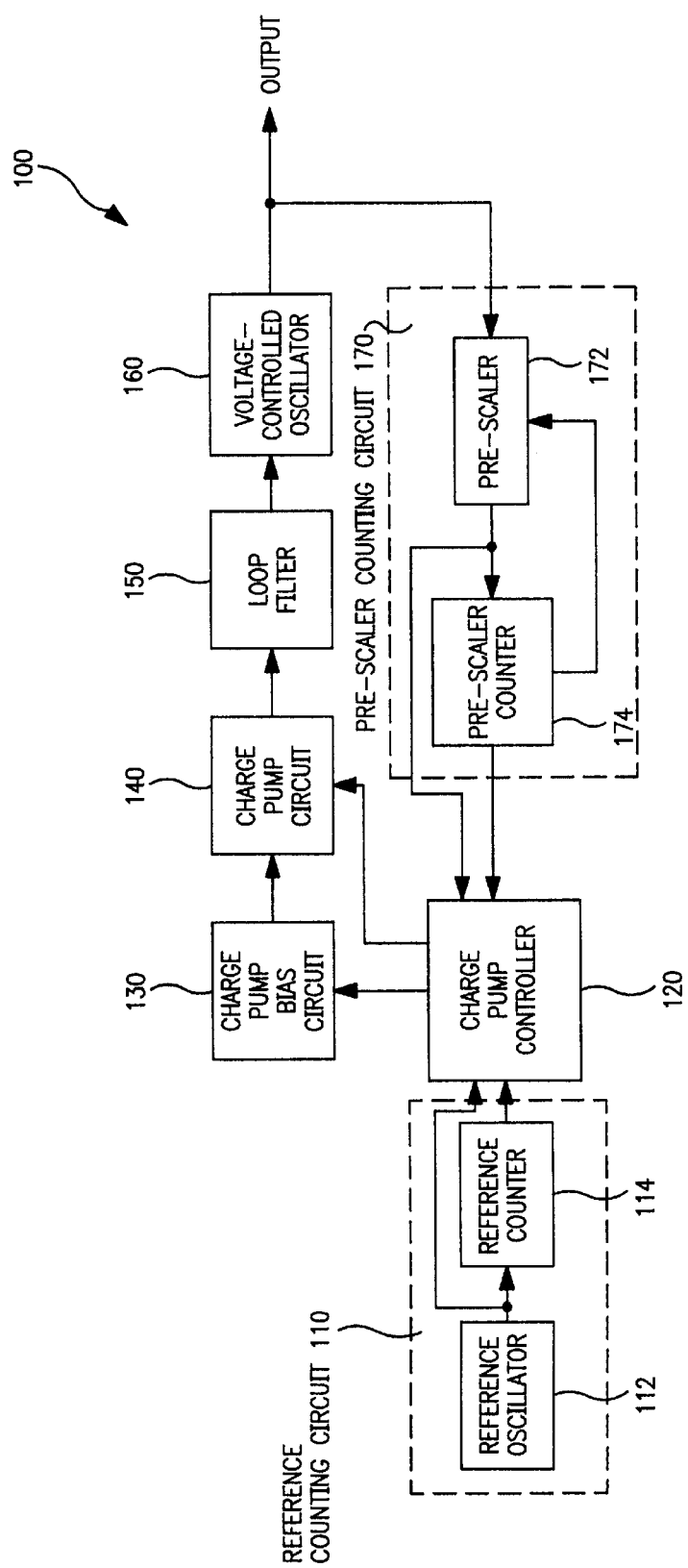
FIG. 1 is a diagram illustrating a phase-locked loop (PLL) circuit in which one embodiment of the invention can be practiced.

FIG. 1 is a diagram illustrating a phase-locked loop (PLL) circuit 100 in which one embodiment of the invention can be practiced. The PLL circuit 100 includes a reference counting circuit 110, a charge pump controller 120, a charge pump bias circuit 130, a charge pump circuit 140, a loop filter 150, a voltage-controlled oscillator 160, and a pre-scaler circuit 170.

The reference counting circuit 110 generates a highly stable reference signal to be used for phase error generation in the charge pump controller 120. The reference counting circuit 110 includes a reference oscillator 112 and a reference counter 114. The reference oscillator 112 generates a periodic waveform of fixed a frequency $f_{OSC}$. In general, the generated periodic waveform has low but highly accurate, stable frequency. This periodic waveform serves as a reference clock for the reference counter 114 and the charge pump controller 120. The reference counter 114 divides the reference clock by a predetermined factor and generates two signals: a reference count signal and a look-ahead reference count signal. The reference counter 114 can be implemented as a divide-by-N counter. The reference count signal is essentially a divide-by-N output of the counter having a frequency equal to $f_{OSC}/N$. The waveform of the reference count signal consists of periodic pulses with a period of $N/f_{OSC}$. The look-ahead reference count signal is similar to the reference count signal except it consists of pulses that are activated before the corresponding reference pulses by a predetermined time interval. In one embodiment, this predetermined time interval is about a few clock cycles.

The charge pump controller 120 provides control signals to the charge pump bias circuit 130 and the charge pump circuit 140. The charge pump controller 120 generates an enable signal to enable/disable the charge pump bias circuit 130. In addition, the charge pump controller 120 generates direction control signals to the charge pump circuit 140. These direction control signals include an UP direction signal and a DOWN direction signal. The UP and DOWN direction signals increase and decrease the amount of current pumped by the charge pump circuit 140, respectively. When the PLL circuit is out of lock the charge pump controller 120 continuously enables the charge pump bias circuit 130. When the PLL circuit is locked the charge pump controller 120 enables the charge pump bias circuit 130 when it is about time to generate current for the loop filter 150, and de-activates the enable signal to disable the bias circuit just after the charge pump circuit 130 is finished generating current to the loop filter 150. By disabling the charge pump bias circuit 130 during idle time interval, the charge pump controller 120 operates to save power for the PLL circuit.

The charge pump bias circuit 130 biases the charge pump circuit 140 by providing a bias reference signal which controls the amount of current to be generated by the charge pump circuit 140. The charge pump circuit 140 pumps up or down the current to the loop filter 150 based on the UP and DOWN direction control signals from the charge pump controller 120, respectively.

The loop filter 150 receives the charge, or current, from the charge pump circuit 140 and generates a voltage proportional to the amount of the received current. The loop filter 150 also controls the dynamics or the temporal response of the PLL circuit. The VCO 160 generates a output signal having a frequency determined by the voltage from the loop filter 150.

The pre-scale counting circuit 170 provides a feedback path to the charge pump controller 120. The pre-scale counting circuit 170 includes a pre-scaler 172 and a pre-scale counter 174. The pre-scaler 172 essentially pre-scales the output signal by some predetermined factor. The pre-scaler 172 is typically a high frequency divider that can divide the output signal down to a rate that can be input to the pre-scale counter 174. The pre-scaler 172 also provides a pre-scale clock to the pre-scale counter 174 and the charge pump controller 120. The pre-scale clock may have a variable frequency due to the variable output waveform while the PLL circuit is trying to lock. When the PLL circuit is in lock, the pre-scale clock has a frequency of $f_{PS}$. The pre-scale counter 174 divides the pre-scaled output signal by a factor M. The pre-scale counter 174 operates in a similar manner as the reference counter 114 in that it generates two signals: a pre-scale count signal and a look-ahead pre-scale count signal. The pre-scale counter 174 can be implemented as a divide-by-M counter. The pre-scale count signal is essentially a divide-by-M output of the counter having a frequency equal to $f_{PS}/N$. The waveform of the pre-scale count signal consists of periodic pulses with a period of $N/f_{PS}$. The look-ahead pre-scale count signal is similar to the pre-scale count signal except it consists of pulses that are activated before the corresponding pre-scale pulses by a predetermined time interval. In one embodiment, this predetermined time interval is about a few clock cycles.

Figure 2:
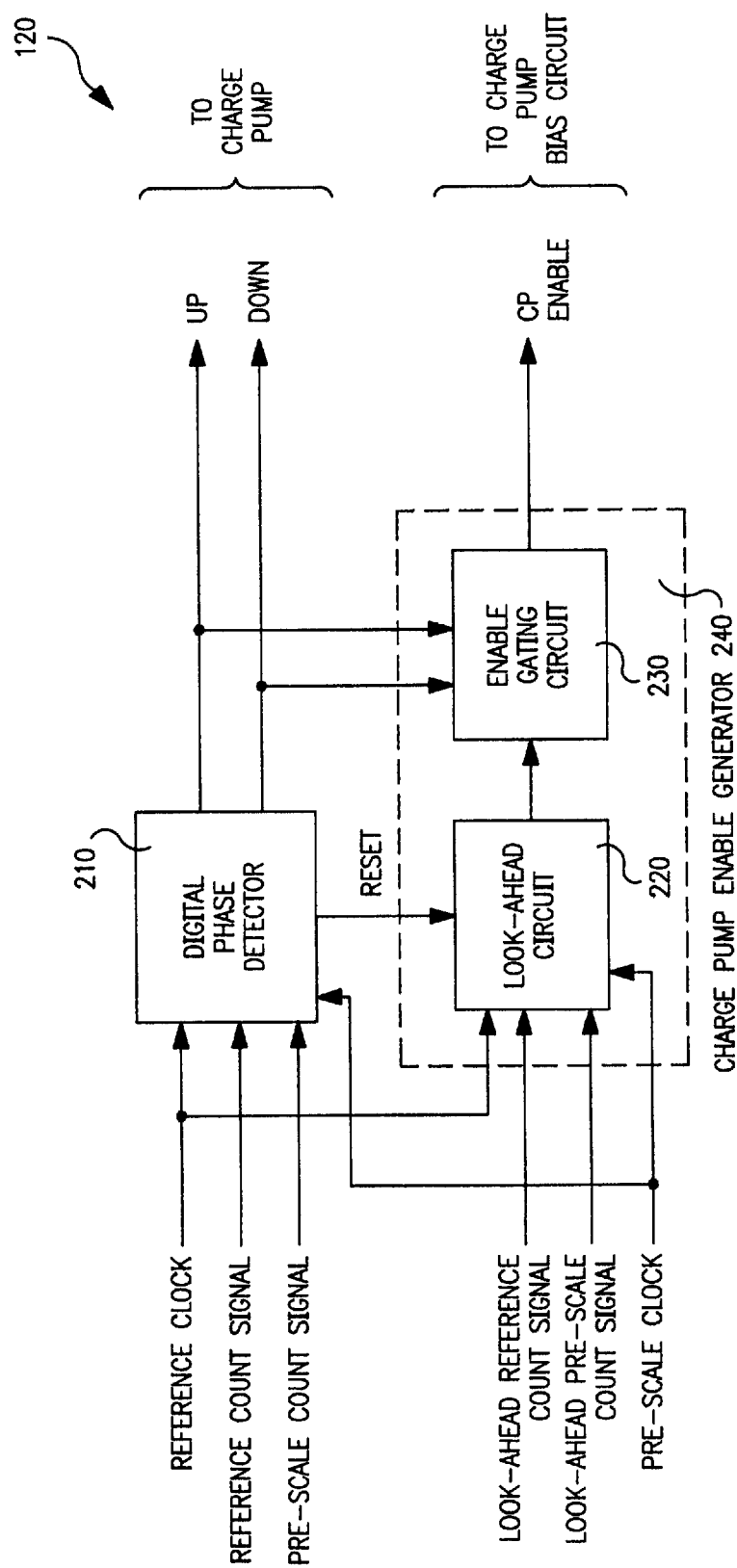
FIG. 2 is a diagram illustrating a charge pump controller shown in FIG. 1 according to one embodiment of the invention.

FIG. 2 is a diagram illustrating a charge pump controller 120 shown in FIG. 1 according to one embodiment of the invention. The charge pump controller 120 includes a digital phase detector 210 and a charge pump enable generator 240.

The digital phase detector 210 generates direction control signals to control the direction of the current pumped by the charge pump circuit 140 (FIG. 1). The direction control signals include the UP and DOWN direction signals. The digital phase detector 210 receives the reference clock, the reference count signal, the pre-scale clock, and the pre-scale count signal. The digital phase detector 210 also generates a RESET signal to the charge pump enable generator 240.

The charge pump enable generator 240 generates the charge pump enable signal to enable the charge pump bias circuit 130 (FIG. 1). The charge pump enable generator 240 includes a look-ahead circuit 220 and an enable gating circuit 230. The look-ahead circuit 220 generates a look-ahead signal to the enable gating circuit. The look-ahead circuit 220 receives the reference clock, the pre-scale clock, the look-ahead reference count signal, and the look-ahead pre-scale count signal. The enable gating circuit 230 receives the UP and DOWN direction signals from the digital phase detector 210 and gates the look-ahead signal to generate the charge pump enable signal.

Figure 3A:
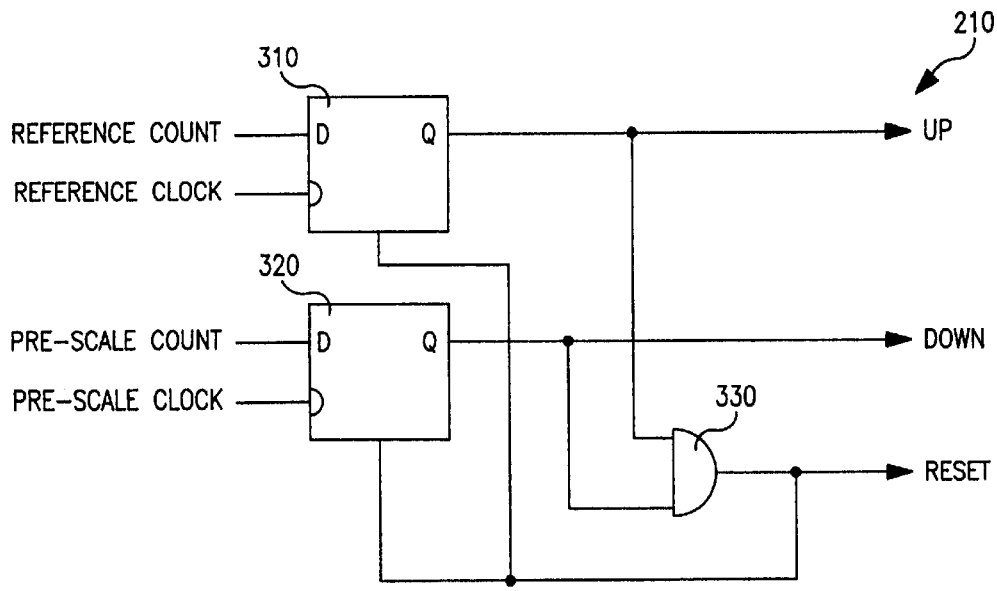
FIG. 3A is a diagram illustrating a digital phase detector shown in FIG. 2 according to one embodiment of the invention.

FIG. 3A is a diagram illustrating a digital phase detector 210 shown in FIG. 2 according to one embodiment of the invention. The digital phase detector 210 includes first and second synchronizers 310 and 320 and a reset generator 330.

The first synchronizer 310 synchronizes the reference count signal using the reference clock to generate the UP direction signal. The second synchronizer 320 synchronizes the pre-scale count signal using the pre-scale clock to generate the DOWN signal. The reset generator 330 combines the UP and DOWN signals to generate a reset signal which resets the synchronizers 310 and 320. In one embodiment, the first and second synchronizers 310 and 320 are D flip-flops and the reset generator 330 is an AND gate. When the first and second synchronizers 310 and 320 are reset, the UP and DOWN signals are negated.

When the PLL circuit 100 is locked, the UP and DOWN direction signals are both asserted at the same time. The reset generator 330 asserts the reset signal which resets the first and second synchronizers 310 and 320, negating the UP and DOWN direction signals. When the PLL circuit 100 is not locked, one of the UP and DOWN direction signals is negated and the reset generator 330 negates the reset signal, allowing the synchronizers 310 and 320 to continue asserting one of the UP and DOWN direction signals as appropriate.

Figure 3B:
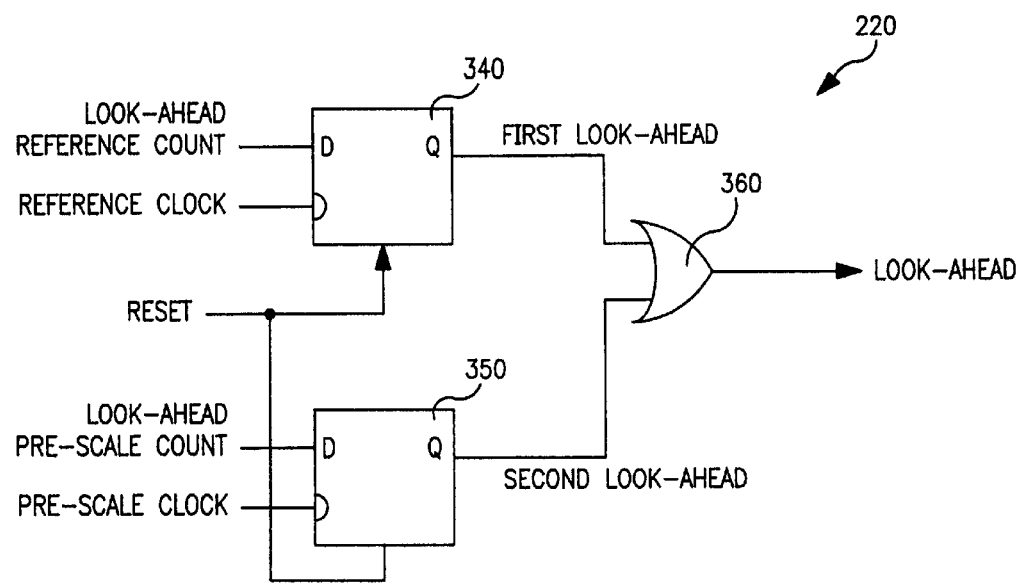
FIG. 3B is a diagram illustrating a look-ahead circuit shown in FIG. 2 according to one embodiment of the invention.

FIG. 3B is a diagram illustrating a look-ahead circuit 220 shown in FIG. 2 according to one embodiment of the invention. The look-ahead circuit 220 includes third and fourth synchronizers 340 and 350, and a combiner 360.

The third synchronizer 340 synchronizes the look-ahead reference count signal using the reference clock to generate a first look-ahead signal. The fourth synchronizer 350 synchronizes the look-ahead pre-scale count signal using the pre-scale clock to generate a second look-ahead signal. The combiner 360 combines the first and second signals to generate the look-ahead signal. In one embodiment, the combiner 360 is an OR gate. The look-ahead signal essentially acts to trigger the charge pump bias circuit 130 to power up the charge pump circuit 140 just before an output pulse is generated.

The third and fourth synchronizers 340 and 350 are also reset by the reset signal. This occurs when the PLL circuit 100 is locked as discussed in FIG. 3A. When the third and fourth synchronizers 340 and 350 are reset, the first and second look-ahead signals are negated, and the resulting look-ahead signal is also negated. When the look-ahead signal is negated, the charge pump bias circuit 130 (FIG. 1) is disabled and the charge pump circuit 140 is powered down, resulting in saved power consumption. In other words, no or little power is consumed by the charge pump circuit 140 (FIG. 1) when the PLL circuit is locked.

Figure 3C:
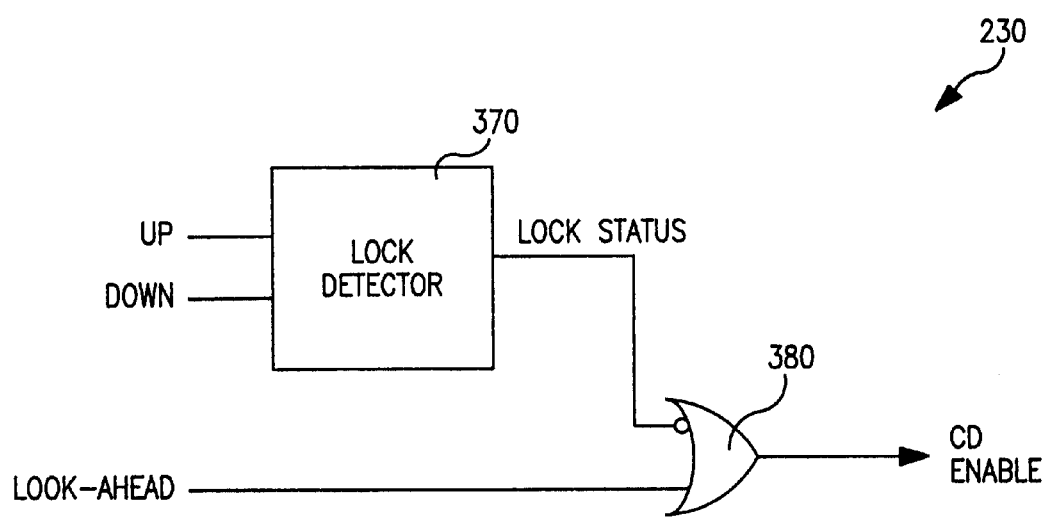
FIG. 3C is a diagram illustrating an enable gating circuit shown in FIG. 2 according to one embodiment of the invention.

FIG. 3C is a diagram illustrating an enable gating circuit 230 shown in FIG. 2 according to one embodiment of the invention. The enable gating circuit 230 includes a lock detector 270 and a combiner 380.

The lock detector 370 receives the UP and DOWN signals to generate a lock status signal. The PLL circuit 100 is locked when the output signal is synchronized with the reference clock. When the PLL circuit 100 is locked, the UP and DOWN signals have very small pulse widths and occur almost simultaneously. The lock detector 370 senses this condition and asserts the lock status signal. The combiner 380 combines the lock status signal and the look-ahead signal to generate the charge pump enable signal. The combiner 380 essentially gates the look-ahead signal with the lock status signal. In one embodiment, the combiner is an OR gate with one input being inverted.

When the PLL circuit is not locked, the lock status signal is negated. The combiner 380 then asserts the charge pump enable signal regardless of the look-ahead signal. Therefore, the charge pump circuit 140 (FIG. 1) is enabled when the PLL is not locked. When the PLL circuit is locked, the lock status signal is asserted. The combiner 380 therefore generates the charge pump enable signal according to the look-ahead signal. If the look-ahead signal is asserted, the charge pump enable signal is asserted, enabling the charge pump bias circuit 130 (FIG. 1). This corresponds to the predetermined time interval before the charge pump circuit 140 pumps current into the loop filter 150. If the look-ahead signal is negated, the charge pump enable signal is negated, disabling the charge pump bias circuit 130. The charge pump circuit 140 is therefore powered down, resulting in power saving.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a digital phase detector to generate direction control signals based on a reference count signal and a pre-scale count signal from reference and pre-scale counting circuits, respectively, the direction control signals including an up direction signal and a down direction signal and controlling direction of current pumped by a charge pump circuit biased by a charge pump bias circuit, the digital phase detector comprising:
   a first synchronizer to generate the up direction signal based on the reference count signal from the reference counting circuit, a second synchronizer to generate the down direction signal based on the pre-scale count signal from the pre-scale counting circuit, and a reset generator coupled to the first and second synchronizers to generate a reset signal, the reset signal resetting the first and second synchronizers; and
   a charge pump enable generator coupled to the reference and pre-scale counting circuits to generate an enable signal based on a look-ahead reference count signal and a look-ahead pre-scale count signal from the reference and pre-scale counting circuits, respectively, the look-ahead reference and pre-scale count signals being generated before the corresponding reference and pre-scale count signals by a predetermined time interval, the enable signal powering down the charge pump bias circuit after the charge pump circuit pumps the current.

2. The apparatus of claim 1 wherein the charge pump enable generator comprises:
   a look-ahead circuit to generate a look-ahead signal at a time interval before the direction control signals are generated; and
   an enable gating circuit coupled to the look-ahead circuit to gate the look-ahead signal with a lock status signal, the gated look-ahead signal being the enable signal.

3. The apparatus of claim 2 wherein the look-ahead circuit comprises:
   a third synchronizer to generate a first look-ahead signal based on the look-ahead reference count signal from the reference counting circuit;
   a fourth synchronizer to generate a second look-ahead signal based on the look-ahead pre-scale count signal from the pre-scale counting circuit; and
   a combiner coupled to the third and fourth synchronizers to combine the first and second look-ahead signals, the combined first and second look-ahead signals corresponding to the look-ahead signal.

4. The apparatus of claim 3 wherein the third and fourth synchronizers are reset by the reset signal.

5. The apparatus of claim 4 wherein the enable gating circuit comprises:
   a lock detector to generate the lock status signal from the up and down direction signals; and
   a combiner coupled to the lock detector and the look-ahead circuit to combine the look-ahead signal and the lock status signal, the combined look-ahead signal and the lock status signal corresponding to the gated look-ahead signal.

6. The apparatus of claim 3 wherein the first and third synchronizers are clocked by a reference clock from the reference counting circuit and wherein the second and fourth synchronizers are clocked by a pre-scale clock from the pre-scale counting circuit.

7. The apparatus of claim 3 wherein the reset generator is an AND gate.

8. The apparatus of claim 3 wherein the combiner is an OR gate.

9. A method comprising:
   generating direction control signals by a digital phase detector based on a reference count signal and a pre-scale count signal from reference and pre-scale counting circuits, respectively, the direction control signals including an up direction signal and a down direction signal and controlling direction of current pumped by a charge pump circuit biased by a charge pump bias circuit the generating direction control signals comprising:
   generating the up direction signal by a first synchronizer based on the reference count signal from the reference counting circuit, generating the down direction signal by a second synchronizer based on the pre-scale count signal from the pre-scale counting circuit, and generating a reset signal by a reset generator, the reset signal resetting the first and second synchronizers; and generating an enable signal by a charge pump enable generator based on a look-ahead reference counting signal and a look-ahead pre-scale count signal from the reference and pre-scale counting circuits, respectively, the look-ahead reference and pre-scale count signals being generated before the corresponding reference and pre-scale count signals by a predetermined time interval, the enable signal powering down the charge pump bias circuit after the charge pump circuit pumps the current.

10. The method of claim 9 wherein generating the enable signal comprises:

generating a look-ahead signal by a look-ahead circuit at a time interval before the direction control signals are generated; and gating the look-ahead signal with a lock status signal by an enable gating circuit, the gated look-ahead signal being the enable signal.

11. The method of claim 10 wherein generating the look-ahead signal comprises:

generating a first look-ahead signal by a third synchronizer based on the look-ahead reference count signal from the reference counting circuit;

generating a second look-ahead signal by a fourth synchronizer based on the look-ahead pre-scale count signal from the pre-scale counting circuit; and combining the first and second look-ahead signals by a combiner, the combined first and second look-ahead signals corresponding to the look-ahead signal.

12. The method of claim 11 wherein the third and fourth synchronizers are reset by the reset signal.

13. The method of claim 12 wherein gating the look-ahead signal comprises:

generating a lock status signal from the up and down direction signals by a lock detector; and combining the look-ahead signal with the lock status signal, the combined look-ahead signal and the lock status signal corresponding to the gated look-ahead signal.

14. The method of claim 11 wherein the first and third synchronizers are clocked by a reference clock from the reference counting circuit and wherein the second and fourth synchronizers are clocked by a pre-scaler clock from the pre-scale counting circuit.

15. The method of claim 11 wherein the reset generator is an AND gate.

16. The method of claim 11 wherein the combiner is an OR gate.

17. A circuit comprising:

a charge pump circuit to pump current to a loop filter;

a charge pump bias circuit coupled to the charge pump circuit to bias the charge pump circuit; and a charge pump controller coupled to the charge pump circuit and the charge pump bias circuit to control the charge pump bias circuit, the charge pump controller comprising:

a digital phase detector to generate direction control signals based on a reference count signal and a pre-scale count signal from reference and pre-scale counting circuits, respectively, the direction control signals including an up direction signal and a down direction signal and controlling direction of current pumped by the charge pump circuit, the digital phase detector comprising:

a first synchronizer to generate the up direction signal based on the reference count signal from the reference counting circuit, a second synchronizer to generate the down direction signal based on the pre-scale count signal from the pre-scale counting circuit, and a reset generator coupled to the first and second synchronizers to generate a reset signal, the reset signal resetting the first and second synchronizers, and a charge pump enable generator coupled to the reference and pre-scale counting circuits to generate an enable signal based on a look-ahead reference count signal and a look-ahead pre-scale count signal from the reference and pre-scale counting circuits, respectively, the look-ahead reference and pre-scale count signals being generated before the corresponding reference and pre-scale count signals by a predetermined time interval, the enable signal powering down the charge pump bias circuit after the charge pump circuit pumps the current.

18. The PLL circuit of claim 17 wherein the charge pump enable generator comprises:

a look-ahead circuit to generate a look-ahead signal at a time interval before the direction control signals are generated; and an enable gating circuit coupled to the look-ahead circuit to gate the look-ahead signal with a lock status signal, the gated look-ahead signal being the enable signal.

19. The PLL circuit of claim 18 wherein the look-ahead circuit comprises:

a third synchronizer to generate a first look-ahead signal based on the look-ahead reference count signal from the reference counting circuit;

a fourth synchronizer to generate a second look-ahead signal based on the look-ahead pre-scale count signal from the pre-scale counting circuit; and a combiner coupled to the third and fourth synchronizers to combine the first and second look-ahead signals, the combined first and second look-ahead signals corresponding to the look-ahead signal.

20. The PLL circuit of claim 19 wherein the third and fourth synchronizers are reset by the reset signal.

21. The PLL circuit of claim 20 wherein the enable gating circuit comprises:

a lock detector to generate the lock status signal from the up and down direction signals; and a combiner coupled to the lock detector and the look-ahead circuit to combine the look-ahead signal and the lock status signal, the combined look-ahead signal and the lock status signal corresponding to the gated look-ahead signal.

22. The PLL circuit of claim 19 wherein the first and third synchronizers are clocked by a reference clock from the reference counting circuit and wherein the second and fourth synchronizers are clocked by a pre-scale clock from the pre-scale counting circuit.

23. The PLL circuit of claim 19 wherein the reset generator is an AND gate.

24. The PLL circuit of claim 19 wherein the combiner is an OR gate.

* * * * *